United States Patent
Yamaguchi

(10) Patent No.: US 10,283,488 B2
(45) Date of Patent: May 7, 2019

(54) SEMICONDUCTOR MODULE

(71) Applicant: DENSO CORPORATION, Kariya, Aichi-pref. (JP)

(72) Inventor: Akihiro Yamaguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/748,210

(22) PCT Filed: Aug. 25, 2016

(86) PCT No.: PCT/JP2016/074729
§ 371 (c)(1),
(2) Date: Jan. 29, 2018

(87) PCT Pub. No.: WO2017/047345
PCT Pub. Date: Mar. 23, 2017

(65) Prior Publication Data
US 2018/0226383 A1   Aug. 9, 2018

(30) Foreign Application Priority Data

Sep. 18, 2015 (JP) ................. 2015-185802

(51) Int. Cl.
*H01L 25/00* (2006.01)
*H01L 25/07* (2006.01)
(Continued)

(52) U.S. Cl.
CPC ............ *H01L 25/072* (2013.01); *H01L 24/00* (2013.01); *H01L 25/07* (2013.01); *H01L 25/18* (2013.01);
(Continued)

(58) Field of Classification Search
CPC .............................. H01L 25/072; H01L 25/07
USPC ............................................. 257/76; 361/699
See application file for complete search history.

(56) References Cited

U.S. PATENT DOCUMENTS

2002/0024129 A1* 2/2002 Hirahara ............... H01L 25/071
257/691
2006/0044772 A1* 3/2006 Miura .................. H01L 25/0655
361/767
(Continued)

FOREIGN PATENT DOCUMENTS

EP          0 359 513 A2    3/1990
JP          H07-273276 A    10/1995
(Continued)

*Primary Examiner* — David Vu
*Assistant Examiner* — Brandon C Fox
(74) *Attorney, Agent, or Firm* — Posz Law Group, PLC

(57) ABSTRACT

A semiconductor module includes: a substrate having an insulating layer and a connecting portion connecting front and rear surfaces of the insulating layer; a first pattern on a front surface of the substrate; a second pattern on a rear surface of the substrate; a first semiconductor device disposed adjacent to the front surface of the substrate and including a first switching device having a lateral structure; a second semiconductor device disposed adjacent to the rear surface of the substrate and including a second switching device having the lateral structure; and a capacitor. A path formed by the first pattern and the first semiconductor device and a path formed by the second pattern and the second semiconductor device are opposed to each other across the substrate, and in the paths, currents flow in directions opposite to each other.

15 Claims, 14 Drawing Sheets

(51) Int. Cl.
*H01L 25/18* (2006.01)
*H02M 7/48* (2007.01)
*H01L 23/00* (2006.01)
*H02M 7/00* (2006.01)
*H02M 7/5387* (2007.01)

(52) U.S. Cl.
CPC ............ *H02M 7/003* (2013.01); *H02M 7/48* (2013.01); *H02M 7/53875* (2013.01); *H01L 2924/1304* (2013.01)

(56) References Cited

U.S. PATENT DOCUMENTS

| | | |
|---|---|---|
| 2010/0237507 A1 | 9/2010 | Yamada et al. |
| 2011/0233758 A1 | 9/2011 | Machida et al. |
| 2013/0056755 A1* | 3/2013 | Hatai ................ H01L 23/49805 257/77 |
| 2014/0334203 A1* | 11/2014 | Honda ................ H02M 7/003 363/56.12 |
| 2015/0243576 A1 | 8/2015 | Miyakoshi et al. |
| 2016/0036305 A1* | 2/2016 | Kawata ................ B62D 5/0412 180/443 |
| 2017/0301599 A1 | 10/2017 | Miyakoshi et al. |

FOREIGN PATENT DOCUMENTS

| | | |
|---|---|---|
| JP | 2004-022844 A | 1/2004 |
| JP | 2008-198750 A | 8/2008 |
| JP | 2010-205960 A | 9/2010 |
| JP | 2011-172442 A | 9/2011 |
| JP | 2014-038982 A | 2/2014 |
| JP | 2015-162516 A | 9/2015 |

* cited by examiner

SEMICONDUCTOR MODULE

CROSS REFERENCE TO RELATED APPLICATIONS

This application is a U.S. national phase of International Application No. PCT/JP2016/074729 filed on Aug. 25, 2016 and is based on Japanese Patent Application No. 2015-185802 filed on Sep. 18, 2015, the disclosures of which are incorporated herein by reference.

TECHNICAL FIELD

The present disclosure relates to a semiconductor module including a semiconductor device that has a lateral structure.

BACKGROUND ART

In an inverter circuit that drives a three-phase AC motor or the like, a semiconductor module including switching devices on upper and lower arms, a rectifying device, and the like, has been used. As the switching device, for example, an insulated gate bipolar transistor (IGBT) has been used, and as the rectifying device, for example, a flywheel diode (FWD) device has been used.

In the inverter circuit, by switching on and off the switching devices of the upper and lower arms, the direction of a current flowing through a plurality of coils provided in a motor is controlled to drive the motor. During this switching between on and off, a surge voltage is generated by a parasitic inductance generated by a wiring and the like. Especially, when a large current flows in the semiconductor module, each device provided in the semiconductor module may be broken by the surge voltage.

For dealing with this, there has been proposed a method for suppressing the surge voltage by installing a capacitor in the semiconductor module. However, a new wiring is required as the capacitor is installed, leading to formation of a new parasitic inductance by a wiring for connecting the capacitor and another wiring.

Each loop area of these wirings changes depending on the position of the capacitor, and hence, this parasitic inductance may increase depending on the position of the capacitor. In this case, the surge voltage increases due to the increase in the parasitic inductance, and thus cannot be reduced sufficiently.

Therefore, for example, in a semiconductor module described in Patent Document 1, semiconductor devices of upper and lower arms and an insulating member are disposed on a front surface of a middle-side plate made of metal, a conductive plate is disposed on the insulating member, and a capacitor is disposed on the conductive plate. A high-side plate is made of metal, and is disposed on the semiconductor device of the upper arm. A low-side plate is made of metal, and is disposed on the semiconductor device of the lower arm. The high-side plate and the low-side plate are connected by the conductive plate and the capacitor.

With such a configuration, a current direction flowing through the conductive plate and a current direction flowing through the middle-side plate are opposite to each other, so that a magnetic field generated by a current flowing through the conductive plate and a magnetic field generated by a current flowing through the middle-side plate cancel each other. Hence, it is possible to reduce an effective inductance and suppress the surge voltage.

PRIOR ART DOCUMENT

Patent Document

Patent Document 1: JP 2010-205960 A

SUMMARY OF INVENTION

However, while the semiconductor module described in Patent Document 1 can be used for a semiconductor device having a vertical structure such as an insulated gate bipolar transistor (IGBT) device or a silicon carbide (SiC) device, it cannot be used for a semiconductor device having a lateral structure such as a gallium nitride (GaN) device, which is expected as a next generation device.

With the GaN device having high-speed switching performance, the surge voltage tends to increase in a semiconductor module including the GaN device. Further, the GaN device can be easily broken by the surge voltage due to its low avalanche withstand capability. Hence, in the semiconductor module including the GaN device, it is important to reduce an inductance and suppress the surge voltage.

It is an object of the present disclosure to provide a semiconductor module that includes a semiconductor device having a lateral structure and is capable of suppressing a surge voltage.

According to an aspect of the present disclosure, a semiconductor module includes: a substrate that includes an insulating layer and a connecting portion configured to connect a front surface and a rear surface of the insulating layer; a first pattern that is a wiring pattern disposed on a front surface of the substrate; a second pattern that is a wiring pattern disposed on a rear surface of the substrate; a first semiconductor device that is disposed adjacent to the front surface of the substrate and includes a first switching device having a lateral structure; a second semiconductor device that is disposed adjacent to the rear surface of the substrate and includes a second switching device having the lateral structure; and a capacitor. The first switching device includes a first drain electrode and a first source electrode, and the second switching device includes a second drain electrode and a second source electrode. The first pattern, the second pattern, and the connecting portion form a loop path that is configured to electrically connect the first semiconductor device, the second semiconductor device, and the capacitor. The first source electrode is connected to the second drain electrode, and the first drain electrode is connected to the second source electrode via the capacitor. In the loop path, a path formed by the first pattern and the first semiconductor device and a path formed by the second pattern and the second semiconductor device are opposed to each other across the substrate, and in the paths, currents flow in directions opposite to each other.

According to this, the path formed by the first pattern and the first semiconductor device and the path formed by the second pattern and the second semiconductor device are opposed to each other across the substrate, and in these two paths, the currents flow in directions opposite to each other. Therefore, magnetic fields generated by the currents flowing in the two paths cancel each other and the effective inductance is reduced, so the surge voltage can be suppressed in the semiconductor module that includes the semiconductor device having the lateral structure.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
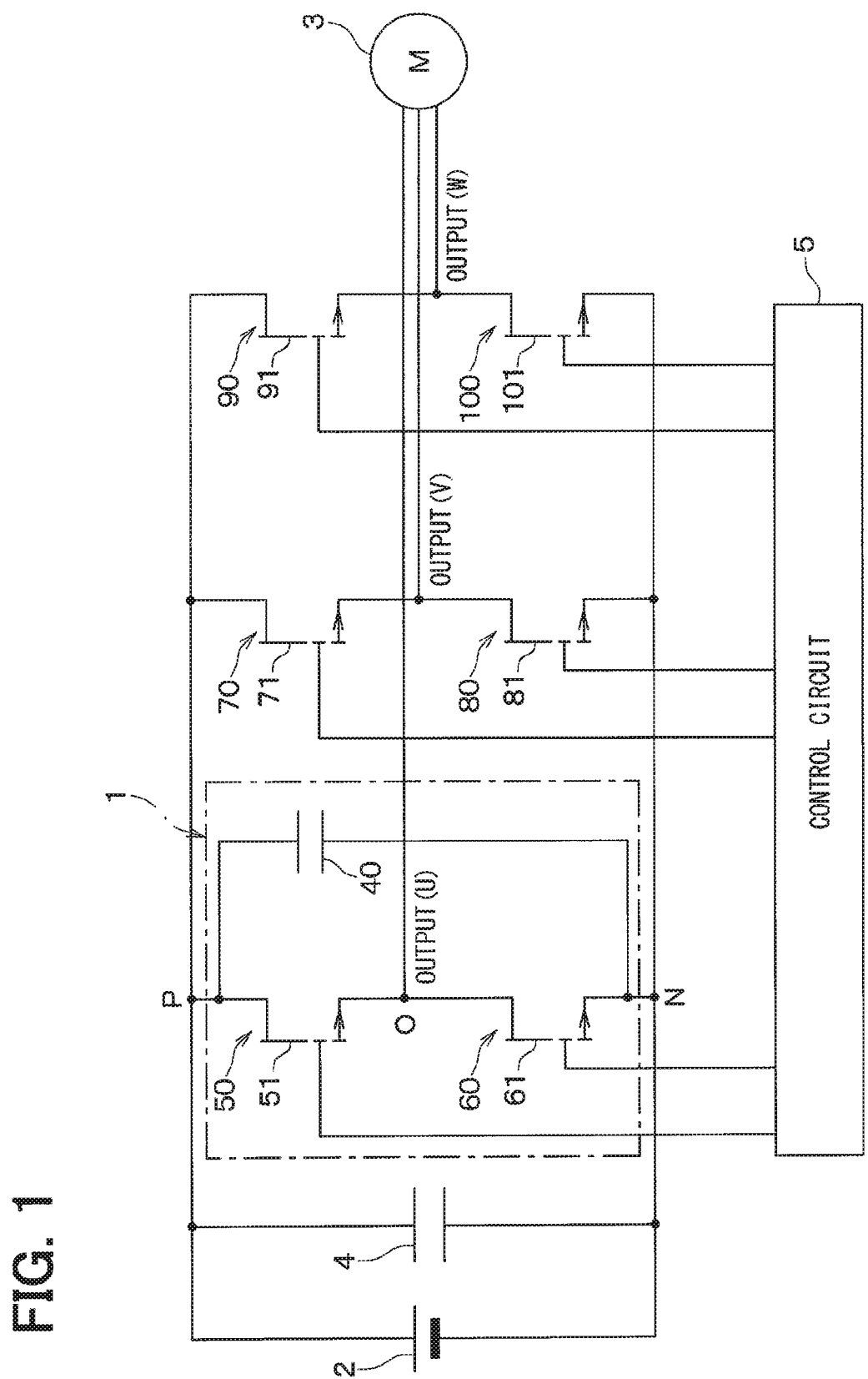
FIG. 1 is a circuit diagram of an inverter circuit including a semiconductor module according to a first embodiment.

Hereinafter, embodiments of the present disclosure will be described with reference to the drawings. In the following embodiments, a description will be given while the same reference numerals are given to the same or equivalent components.

First Embodiment

A first embodiment of the present disclosure will be described. A description will be given of an example in which a semiconductor module 1 according to the present embodiment is used for an inverter circuit that drives a three-phase AC motor or the like for a vehicle.

First, with reference to FIG. 1, a configuration of the inverter circuit provided with the semiconductor module 1 will be described. As shown in FIG. 1, the inverter circuit is for driving a load 3 such as a three-phase AC motor based on a power supply 2. The power supply 2 is a DC power supply for supplying electric power to first semiconductor devices 50, 70, 90 and second semiconductor devices 60, 80, 100, which will be described later.

A smoothing capacitor 4 is connected in parallel with the inverter circuit so that a constant power supply voltage can be formed by reducing ripples at switching and reducing an influence of noise. A control circuit 5 configured to control the first semiconductor devices 50, 70, 90 and the second semiconductor devices 60, 80, 100, which will be described later, is connected to the inverter circuit, and the control circuit 5 performs switching of transistors 51, 71, 91, 61, 81, 101, which will described later.

The inverter circuit is configured such that semiconductor devices on upper and lower arms connected in series are connected in parallel for three phases. The three semiconductor devices on the upper arm (high side) are the first semiconductor devices 50, 70, 90 respectively, and the three semiconductor devices on the lower arm (low side) are the second semiconductor devices 60, 80, 100, respectively.

In the inverter circuit, intermediate potentials of the first semiconductor devices 50, 70, 90 and the second semiconductor devices 60, 80, 100 are applied to the respective phases of a U phase, a V phase, and a W phase of the three-phase AC motor to be the load 3 by turns.

Specifically, the first semiconductor devices 50, 70, 90 and the second semiconductor devices 60, 80, 100 include the transistors 51, 71, 91, 61, 81, 101 that are switching devices each having a lateral structure made of GaN or the like. Each of the transistors 51, 71, 91, 61, 81, 101 has its gate electrode connected to the control circuit 5, and is turned on or off based on a signal from the control circuit 5.

Even when low-level gate voltages are applied to the transistors 51, 71, 91, 61, 81, 101 and the transistors 51, 71, 91, 61, 81, 101 are turned off, a current flows from a source electrode to a drain electrode.

Figure 6:
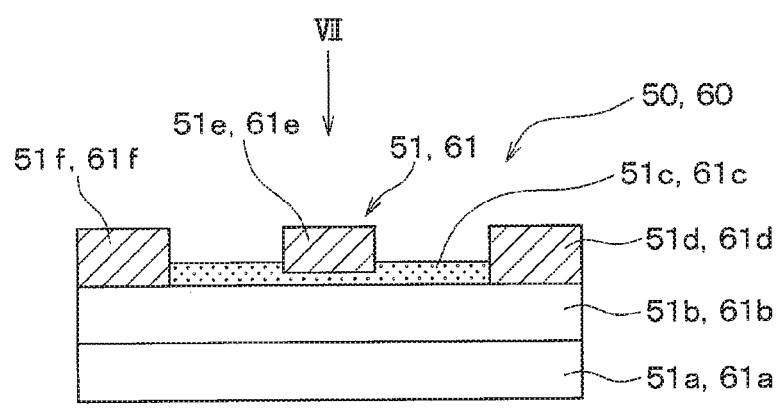
FIG. 6 is a sectional view of a semiconductor device.
Figure 7:
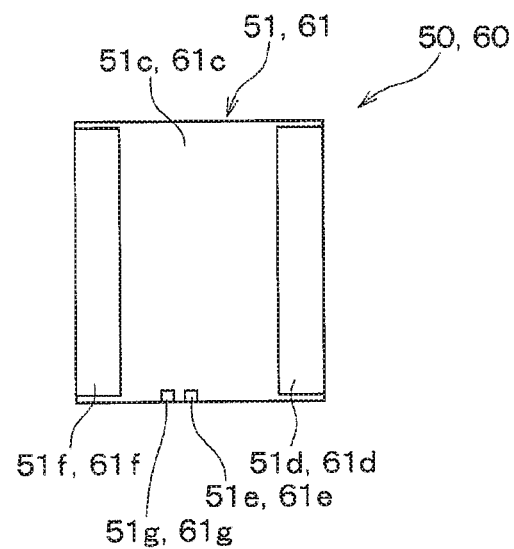
FIG. 7 is a view taken in a direction of an arrow VII of FIG. 6.

As shown in FIGS. 6 and 7 described later, a drain electrode, a gate electrode, and a source electrode of the transistor 51 are referred to as a drain electrode 51$d$, a gate electrode 51$e$, and a source electrode 51$f$, respectively. A drain electrode, a gate electrode, and a source electrode of the transistor 61 are referred to as a drain electrode 61$d$, a gate electrode 61$e$, and a source electrode 61$f$, respectively. Further, as shown in FIG. 7, SS electrodes of the transistors 51, 61 are referred to as SS electrodes 51$g$, 61$g$, respectively. In FIG. 6, illustration of the SS electrodes 51$g$, 61$g$ is omitted.

In the inverter circuit shown in FIG. 1, by performing on-off control on the transistors 51, 71, 91, 61, 81, 101, three-phase AC currents having different cycles are supplied to the three-phase AC motor. This enables drive of the three-phase AC motor.

Each of the transistors 51, 71, 91 corresponds to a first switching device. Each of the transistors 61, 81, 101 corresponds to a second switching device.

In the present embodiment, a semiconductor chip on which the first semiconductor device 50 is formed and a semiconductor chip on which the second semiconductor device 60 is formed are modularized and integrated. That is, the inverter circuit is configured by using the semiconductor module 1 having a 2-in-1 structure in which the two arms are integrated. In the present embodiment, a semiconductor module including the first semiconductor device 70 and the second semiconductor device 80 and applying a voltage to the V phase of the three-phase AC motor is configured in the same manner as the semiconductor module 1. A semiconductor module including the first semiconductor device 90 and the second semiconductor device 100 and applying a voltage to the W phase of the three-phase AC motor is also configured in the same manner as the semiconductor module 1.

Subsequently, a detailed structure of the semiconductor module 1 will be described with reference to FIGS. 1 to 7.

Figure 2:
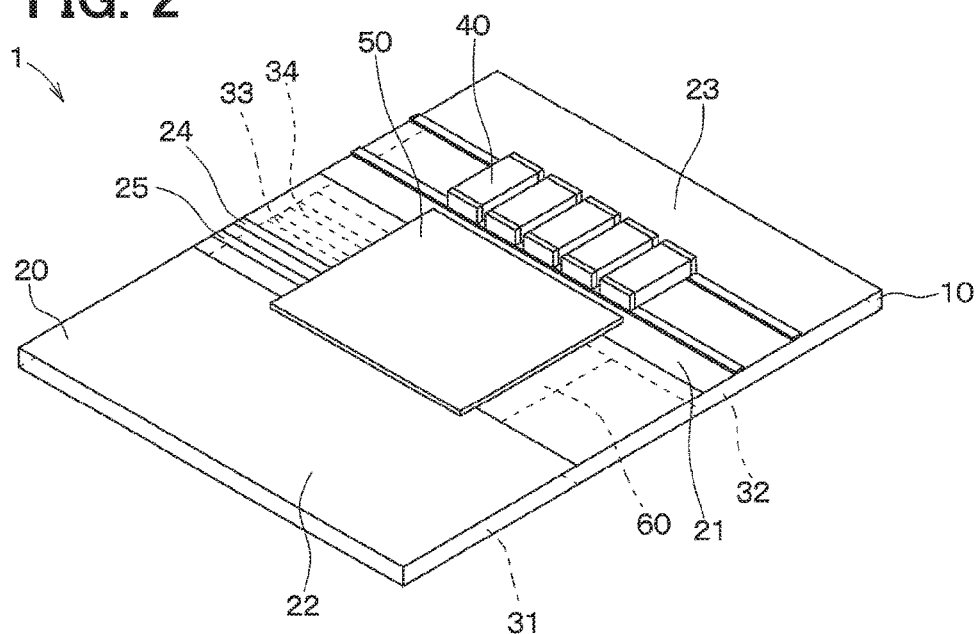
FIG. 2 is a perspective view of the semiconductor module according to the first embodiment.
Figure 3:
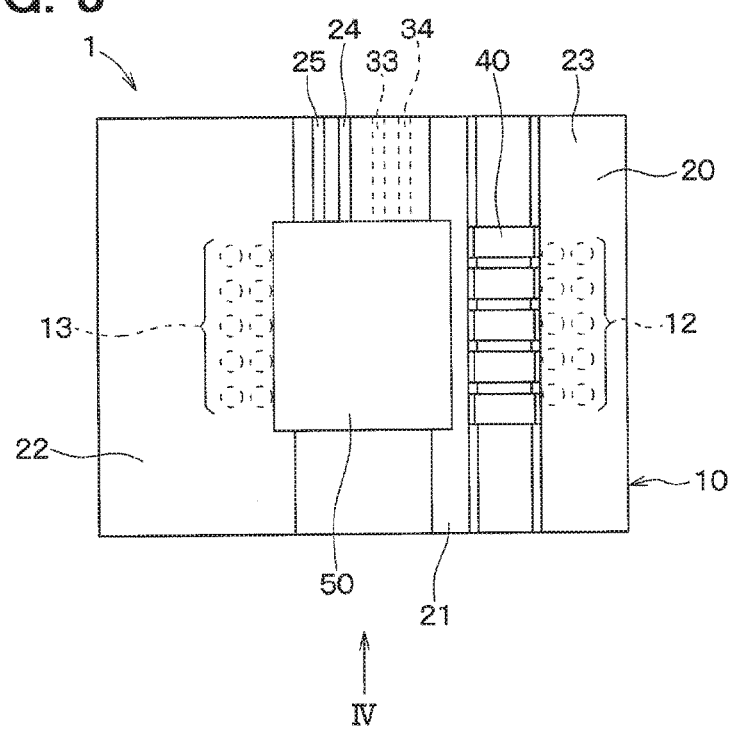
FIG. 3 is a top view of the semiconductor module according to the first embodiment.
Figure 4:
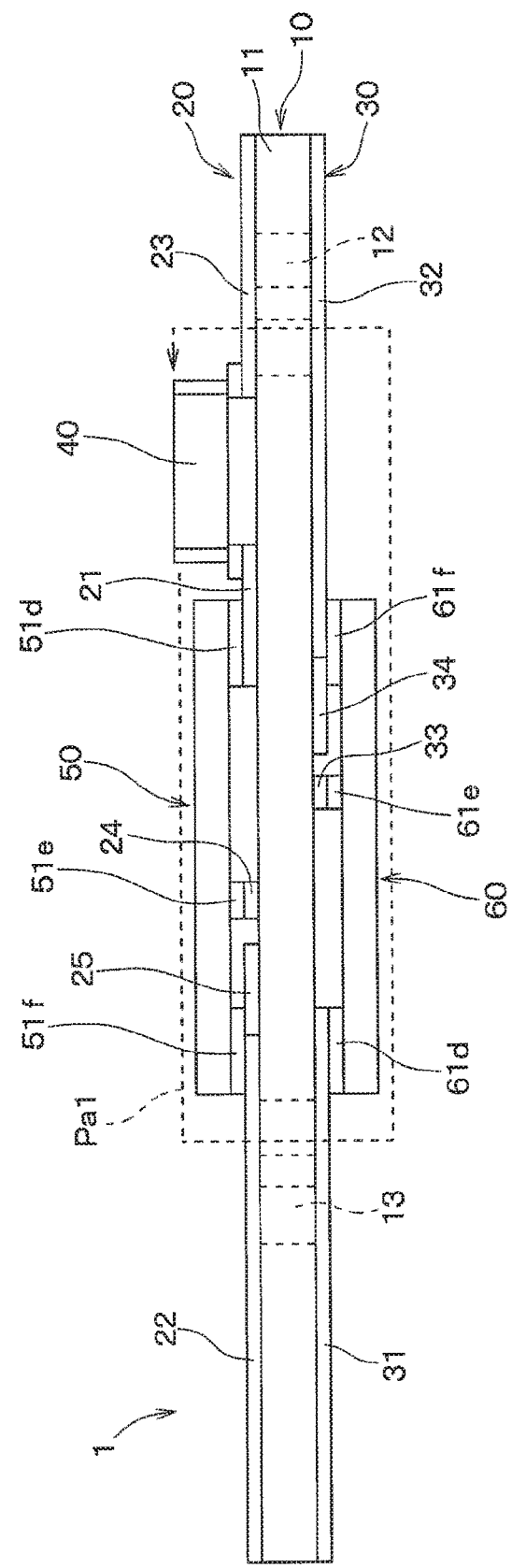
FIG. 4 is a view taken in a direction of an arrow IV of FIG. 3.
Figure 5:
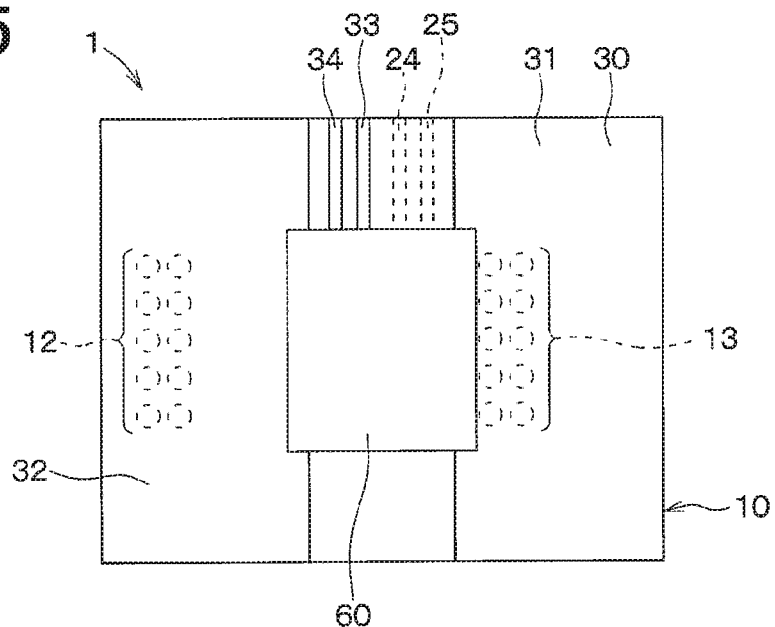
FIG. 5 is a bottom view of the semiconductor module according to the first embodiment.

As shown in FIGS. 3 to 5, the semiconductor module 1 shown in FIG. 2 includes a substrate 10, a first pattern 20, a second pattern 30, a capacitor 40, the first semiconductor device 50, and the second semiconductor device 60. As shown in FIGS. 2 to 5, the capacitor 40 and the first semiconductor device 50 disposed adjacent to a front surface of the substrate 10 and the second semiconductor device 60 disposed adjacent to a rear surface of the substrate 10 are connected to each other through vies 12 and 13 formed in the substrate, and the first pattern 20 and the second pattern 30.

As shown in FIG. 4, the substrate 10 includes an insulating layer 11. The insulating layer 11 is made of resin, for example. Vias are formed in the substrate 10 to connect the front surface and the rear surface of the insulating layer 11. In the present embodiment, a plurality of vias 12 and a plurality of vias 13 are formed in the substrate 10.

The plurality of vias 12 and the plurality of vias 13 are through vias in each of which a conductive material such as Cu is embedded, and correspond to connecting portions. In the inverter circuit of FIG. 1, the plurality of vias 12 are disposed in a portion corresponding to a connection point between the second semiconductor device 60 and the capacitor 40, and connect an N wiring 23 with an N wiring 32, described later. In the inverter circuit of FIG. 1, the plurality of vias 13 are disposed in a portion corresponding to a connection point between the first semiconductor device 50 and the second semiconductor device 60, and connect an O wiring 22 with an O wiring 31, described later. As shown in FIGS. 3 and 5, the plurality of vias 12 and the plurality of vies 13 are arranged in a lattice pattern when viewed from a top surface of the substrate 10.

A wiring pattern made of Cu or the like is formed on each of the front surface and the rear surface of the substrate 10. A wiring pattern formed on the front surface of the substrate 10 is referred to as the first pattern 20 and a wiring pattern formed on the rear surface of the substrate 10 is referred to as the second pattern 30.

As shown in FIG. 3, the first pattern 20 includes a P wiring 21, the O wiring 22, the N wiring 23, a G wiring 24, and an SS wiring 25.

The P wiring 21 is a wiring that connects the capacitor 40 with the first semiconductor device 50. Specifically, there is a portion not coated with a resist on one upper surface of both ends of the P wiring 21, and this portion and one of two electrodes provided in the capacitor 40 are joined by soldering. Of both ends of the P wiring 21, the end on the side opposite to the capacitor 40 is connected to the drain electrode 51d of the transistor 51. Although not shown, the P wiring 21 is connected to the power supply 2, the smoothing capacitor 4, the first semiconductor device 70, and the first semiconductor device 90.

The O wiring 22 is a wiring that connects the via 13 with the first semiconductor device 50. Specifically, as shown in FIG. 3, the O wiring 22 is formed at one end and a periphery of the via 13 and is electrically connected to the via 13. The O wiring 22 is connected to the source electrode 51f of the transistor 51. Although not shown, the O wiring 22 is connected to the load 3.

The N wiring 23 is a wiring that connects the via 12 with the capacitor 40. Specifically, as shown in FIG. 3, the N wiring 23 is formed at one end and a periphery of the via 12 and is electrically connected to the via 12. Further, there is a portion not coated with a resist on an upper surface of an end of the N wiring 23, and this portion and one of the two electrodes provided in the capacitor 40 are joined by soldering. Hence, the P wiring 21 and the N wiring 23 are connected via the capacitor 40. The G wiring 24 is a wiring that connects the gate electrode 51e of the transistor 51 with the control circuit 5.

The SS wiring 25 is a dedicated source wiring provided for driving a gate, and is electrically connected to the source electrode 51f via the SS electrode 51g. As compared with the source wiring, a small amount of current flows through the SS wiring 25, so that noise hardly gets on a driving voltage between the gate and a source at the time of switching. The source electrode 51f and the SS electrode 51g are electrically connected inside the first semiconductor device 50.

As shown in FIG. 5, the second pattern 30 includes the O wiring 31, the N wiring 32, a G wiring 33, and an SS wiring 34. The O wiring 31 is a wiring that connects the via 13 with the second semiconductor device 60. Specifically, as shown in FIG. 5, the O wiring 31 is formed at an end of the via 13 on a side opposite to the O wiring 22 and the periphery of the via 13, and is electrically connected to the via 13. The O wiring 31 is connected to the drain electrode 61d of the transistor 61.

The N wiring 32 is a wiring that connects the via 12 with the second semiconductor device 60. Specifically, as shown in FIG. 5, the N wiring 32 is formed at an end of the via 12 on a side opposite to the N wiring 23 and the periphery of the via 12, and is electrically connected to the via 12. Further, the N wiring 32 is connected to the source electrode 61f of the transistor 61. Although not shown, the N wiring 32 is connected to the power supply 2, the smoothing capacitor 4, the second semiconductor device 80, and the second semiconductor device 100. The G wiring 33 is a wiring that connects the gate electrode 61e of the transistor 61 with the control circuit 5.

The SS wiring 34 is a dedicated source wiring provided for driving the gate, and is electrically connected to the source electrode 61f via the SS electrode 61g. As compared with the source wiring, a small amount of current flows through the SS wiring 34, so noise hardly imposes on the driving voltage between the gate and the source at the time of switching. The source electrode 61f and the SS electrode 61g are electrically connected inside the second semiconductor device 60.

The capacitor 40 is a capacitor for reducing a surge voltage. As shown in FIGS. 2 to 4, in the present embodiment, the capacitor 40 is disposed on the front surface side of the substrate 10. As described above, one of the two electrodes provided in the capacitor 40 is connected to the P wiring 21, and the other is connected to the N wiring 23. In the present embodiment, the semiconductor module 1 includes a plurality of capacitors 40, and the plurality of capacitors 40 are connected in parallel between the P wiring 21 and the N wiring 23.

On the front surface side of the substrate 10, the first semiconductor device 50 of the upper arm (high side) is disposed. As described above, the first semiconductor device 50 includes the transistor 51. As shown in FIG. 6, the transistor 51 is a semiconductor device having a lateral structure and includes a substrate 51a, a stacked body 51b, an insulating layer 51c, the drain electrode 51d, the gate electrode 51e, and the source electrode 51f. Further, as shown in FIG. 7, the transistor 51 includes the SS electrode 51g.

FIG. 6 is a sectional view of the semiconductor device. Since the first semiconductor device 50 and the second semiconductor device 60 have the same cross-sectional shape, the first semiconductor device 50 and the second semiconductor device 60 will be described with reference to FIG. 6.

The substrate 51*a* is made of, for example, Si or the like, and corresponds to the first substrate. The stacked body 51*b* is formed by sequentially stacking a buffer layer (not shown), a GaN layer, and an AlGaN layer on an upper surface of the substrate 51*a*, and corresponds to the first stacked body.

As shown in FIG. 6, the drain electrode 51*d* and the source electrode 51*f* are formed apart from each other on an upper surface of the stacked body 51*b*. The drain electrode 51*d* and the source electrode 51*f* correspond to a first drain electrode and a first source electrode, respectively.

Further, as shown in FIG. 6, the insulating layer 51*c* is formed at a portion between the drain electrode 51*d* and the source electrode 51*f* on the upper surface of the stacked body 51*b*. As shown in FIGS. 6 and 7, on an upper surface of the insulating layer 51*c*, the gate electrode 51*e* is formed at a position distant from the drain electrode 51*d* and the source electrode 51*f*.

As shown in FIG. 7, on the upper surface of the insulating layer 51*c*, the SS electrode 51*g* is formed in a part of a region located between the gate electrode 51*e* and the source electrode 51*f*. The SS electrode 51*g* is formed at a position apart from the gate electrode 51*e* and the source electrode 51*f*, but as described above, the SS electrode 51*g* is electrically connected to the source electrode 51*f* inside the first semiconductor device 50.

In the transistor 51 having such a configuration, by applying a voltage to the gate electrode 51*e*, a current flows from the drain electrode 51*d* to the source electrode 51*f* through a two-dimensional electron gas (2DEG) and a channel that are formed in the stacked body 51*b*.

The first semiconductor device 50 is a package in which the transistor 51 as thus formed is encapsulated with resin (not shown).

On the rear surface side of the substrate 10, the second semiconductor device 60 of the lower arm (low side) is disposed. As described above, the second semiconductor device 60 includes the transistor 61. As shown in FIG. 6, the transistor 61 is a semiconductor device having a lateral structure and includes a substrate 61*a*, a stacked body 61*b*, an insulating layer 61*c*, the drain electrode 61*d*, the gate electrode 61*e*, and the source electrode 61*f*. Further, as shown in FIG. 7, the transistor 61 includes the SS electrode 61*g*.

The substrate 61*a* is made of, for example, Si or the like, and corresponds to the second substrate. The stacked body 61*b* is formed by sequentially stacking a buffer layer (not shown), a GaN layer, and an AlGaN layer on an upper surface of the substrate 61*a*, and corresponds to the second stacked body.

As shown in FIG. 6, the drain electrode 61*d* and the source electrode 61*f* are formed apart from each other on an upper surface of the stacked body 61*b*. The drain electrode 61*d* and the source electrode 61*f* correspond to a second drain electrode and a second source electrode, respectively.

Further, as shown in FIG. 6, the insulating layer 61*c* is formed at a portion between the drain electrode 61*d* and the source electrode 61*f* on the upper surface of the stacked body 61*b*. As shown in FIGS. 6 and 7, on the upper surface of the insulating layer 61*c*, the gate electrode 61*e* is formed at a position distant from the drain electrode 61*d* and the source electrode 61*f*.

As shown in FIG. 7, on the upper surface of the insulating layer 61*c*, the SS electrode 61*g* is formed in a part of a region located between the gate electrode 61*e* and the source electrode 61*f*. The SS electrode 61*g* is formed at a position apart from the gate electrode 61*e* and the source electrode 61*f*, but as described above, the SS electrode 61*g* is electrically connected to the source electrode 61*f* inside the second semiconductor device 60.

In the transistor 61 having such a configuration, by applying a voltage to the gate electrode 61*e*, a current flows from the drain electrode 61*d* to the source electrode 61*f* through a two-dimensional electron gas (2DEG) and a channel that are formed in the stacked body 61*b*.

The second semiconductor device 60 is a package in which the transistor 61 as thus formed is sealed with resin (not shown).

As shown in FIGS. 2 and 4, the first semiconductor device 50 and the second semiconductor device 60 are disposed opposite to each other across the substrate 10.

As shown in FIG. 4, the first pattern 20, the second pattern 30, the via 12, and the via 13 form a loop path Pa1 that is configured to electrically connect the first semiconductor device 50, the second semiconductor device 60, and the capacitor 40.

Specifically, the source electrode 51*f* of the transistor 51 is connected to the drain electrode 61*d* of the transistor 61 via the O wiring 22, the via 13, and the O wiring 31. The drain electrode 51*d* of the transistor 51 is connected to the source electrode 61*f* of the transistor 61 via the P wiring 21, the capacitor 40, the N wiring 23, the via 12, and the N wiring 32.

As shown in FIG. 4, in the loop path Pa1, a path formed by the first pattern 20 and the first semiconductor device 50 and a path formed by the second pattern 30 and the second semiconductor device 60 are opposed to each other across the substrate 10. Then, in these two paths, currents flow in directions opposite to each other. Therefore, magnetic fields generated by the currents flowing in the two paths cancel each other and an effective inductance is reduced, so the surge voltage can be suppressed.

As described above, in the present embodiment, the surge voltage can be suppressed in the semiconductor module 1 including the transistors 51, 61 which are semiconductor devices having the lateral structure.

Further, in the present embodiment, the current path is simple, and the path formed by the first pattern 20 and the first semiconductor device 50 and the path formed by the second pattern 30 and the second semiconductor device 60 in the loop path Pa1 are disposed across the substrate 10. Therefore, a distance between these two paths is short. This improves the effect of canceling the magnetic fields each other generated by the currents flowing in the two paths, and further reduces the effective inductance, so the surge voltage can further be suppressed. In the present embodiment, a loop area is small because the current path is simple. Therefore, in the present embodiment, it is possible to reduce the parasitic inductance and further suppress the surge voltage.

Further, in the present embodiment, the first semiconductor device 50 and the second semiconductor device 60 are disposed opposite to each other across the substrate 10. Thus, as compared with the case where the first semiconductor device 50 and the second semiconductor device 60 are disposed apart from each other when viewed in a direction normal to the front surface of the substrate 10, the area of the portion made up of the first semiconductor device 50 and the second semiconductor device 60 is reduced. This enables reduction in size of the semiconductor module 1.

Further, in the present embodiment, since it is necessary to mount the capacitor 40, the first semiconductor device 50, and the second semiconductor device 60 on the substrate 10 and no other components are required, it is easy to mount the parts and manufacture the semiconductor module 1. In addition, the manufacturing cost of the semiconductor module 1 can be reduced.

In order to further reduce a wiring inductance by reducing the loop area of the loop path Pa1, it is preferable to form the vias 12 and vias 13 near the capacitor 40, the first semiconductor device 50, and the second semiconductor device 60. In order to further reduce the wiring inductance, it is preferable to form many vias 12 and vias 13.

If currents flowing through the G wiring 24, the G wiring 33, the SS wiring 25, and the SS wiring 34 are influenced by the magnetic field generated by the current flowing in the loop path Pa1, malfunction may occur. In order to prevent the occurrence of malfunction, it is preferable to arrange the G wiring 24, the G wiring 33, the SS wiring 25, and the SS wiring 34 orthogonal to the wiring constituting the loop path Pa1 to reduce the influence of the magnetic field.

Second Embodiment

A second embodiment of the present disclosure will be described. In the present embodiment, the number of capacitors 40 is changed with respect to the first embodiment while the others are the same as those in the first embodiment, and therefore, only the difference from the first embodiment will be described.

Figure 8:
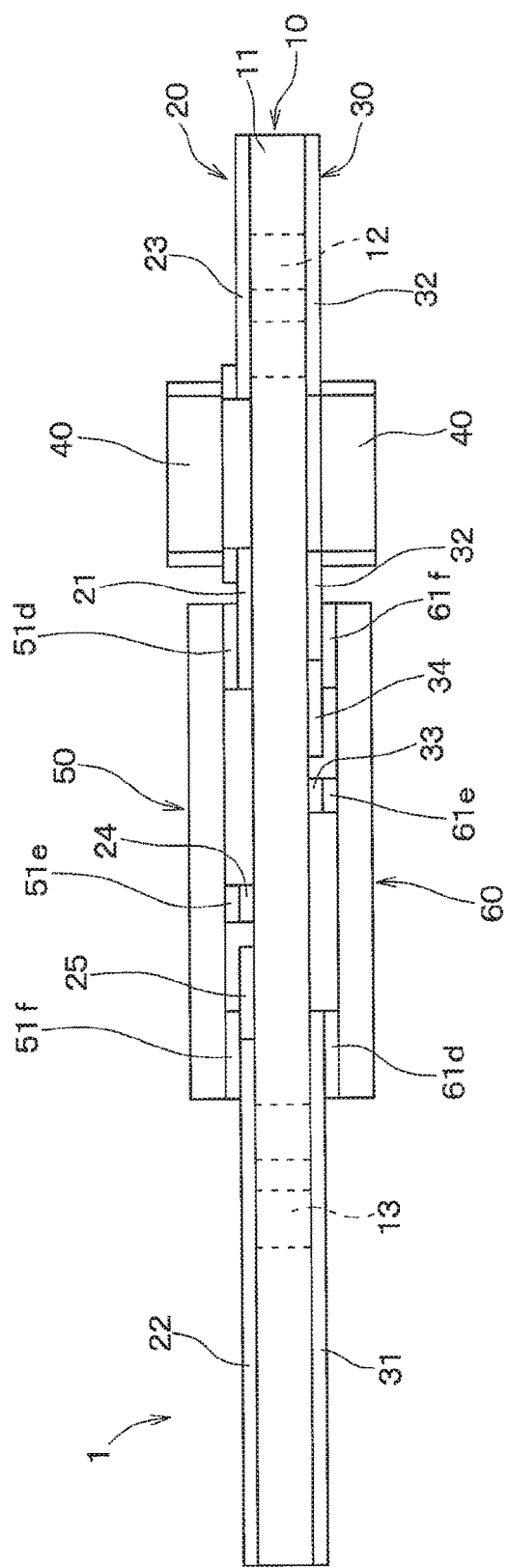
FIG. 8 is a view corresponding to FIG. 4 and showing a semiconductor module according to a second embodiment.

In the present embodiment, a plurality of capacitors 40 are connected in series. Specifically, as shown in FIG. 8, the capacitors 40 are disposed adjacent to the front surface and the rear surface of the substrate 10, and the capacitor 40 adjacent to the front surface of the substrate 10 and the capacitor 40 adjacent to the rear surface of the substrate 10 are connected in series in the loop path Pa1.

An N wiring 32 of the present embodiment is obtained by dividing the N wiring 32 of the first embodiment into two pieces, and the capacitor 40 adjacent to the rear surface of the substrate 10 is connected to the via 12 by one of the two divided pieces of the N wiring 32, and is also connected to the second semiconductor device 60 by the other of the two divided pieces.

Further, in the present embodiment, the plurality of capacitors 40 are disposed adjacent to the rear surface of the substrate 10, and the plurality of capacitors 40 disposed adjacent to the rear surface of the substrate 10 are connected in parallel in the loop path Pa1.

In such a configuration in which the plurality of capacitors 40 are connected in series, for example, even when the capacitors 40 adjacent to the front surface of the substrate 10 are broken and short-circuited, no short circuit occurs in the semiconductor module 1 as a whole unless the capacitors 40 adjacent to the rear surface of the substrate 10 are broken. Therefore, in the semiconductor module 1 having such a configuration, the reliability of the semiconductor module 1 can be enhanced due to reduction in failure of the semiconductor module 1.

Further, in the present embodiment, connecting the plurality of capacitors 40 in series lowers the voltage to be applied to each of the plurality of capacitors 40, and thus it is possible to use a small-sized capacitor having a low withstand voltage. Hence, the semiconductor module 1 can further be reduced in size. Moreover, the manufacturing cost of the semiconductor module 1 can further be reduced.

Third Embodiment

A third embodiment of the present disclosure will be described. The present embodiment is obtained by modifying the arrangement of the capacitor 40 and the configuration of the substrate 10, the first pattern 20 and the second pattern 30 of the first embodiment while the others are the same as those in the first embodiment, and therefore, only the difference from the first embodiment will be described.

Figure 9:
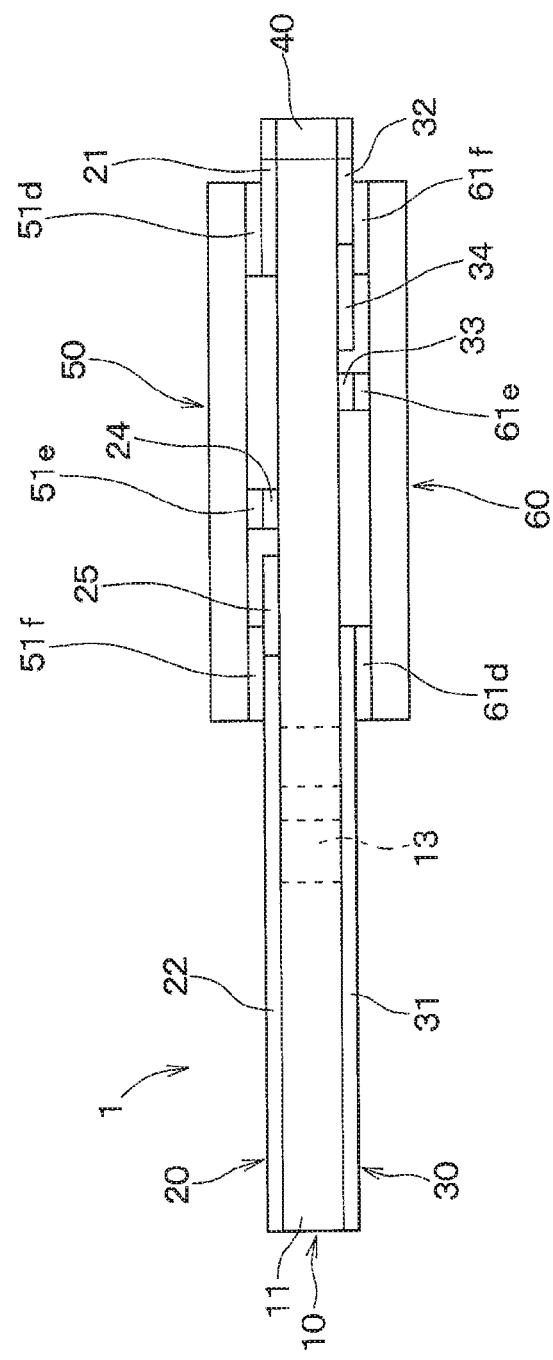
FIG. 9 is a view corresponding to FIG. 4 and showing a semiconductor module according to a third embodiment.

As shown in FIG. 9, in the present embodiment, a capacitor 40 is disposed so that the direction of the current flowing through the capacitor 40 is orthogonal to a substrate 10. The capacitor 40 is disposed so that at least a part of the capacitor 40 overlaps the substrate 10 when viewed from a direction parallel to a front surface of the substrate 10.

Further, in the present embodiment, the substrate 10 does not include a via 12, and a first pattern 20 does not include an N wiring 23. A P wiring 21 is connected to one of two electrodes provided in the capacitor 40 at an end opposite to a first semiconductor device 50. An N wiring 32 is disposed at an end opposite to a second semiconductor device 60 and is connected to one of the two electrodes in the capacitor 40 that is opposite to the P wiring 21. Accordingly, the P wiring 21 and the N wiring 32 are connected via the capacitor 40.

Disposing the capacitor 40 as thus described leads to further reduction in loop area of the loop path Pa1, so the inductance can further be reduced and the surge voltage can further be suppressed in the present embodiment.

Fourth Embodiment

A fourth embodiment of the present disclosure will be described. The present embodiment is obtained by modifying the configuration of the capacitor 40 of the third embodiment while the others are the same as those in the third embodiment, and therefore, only the difference from the first embodiment will be described.

Figure 10:
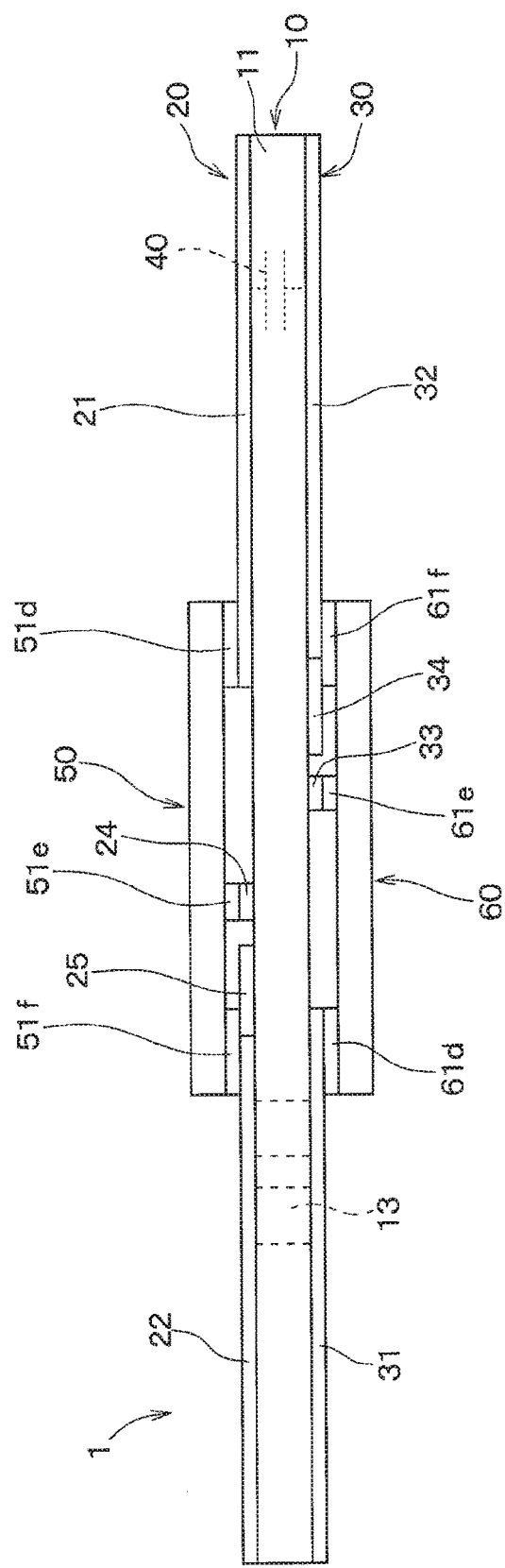
FIG. 10 is a view corresponding to FIG. 4 and showing a semiconductor module according to a fourth embodiment.
Figure 11:
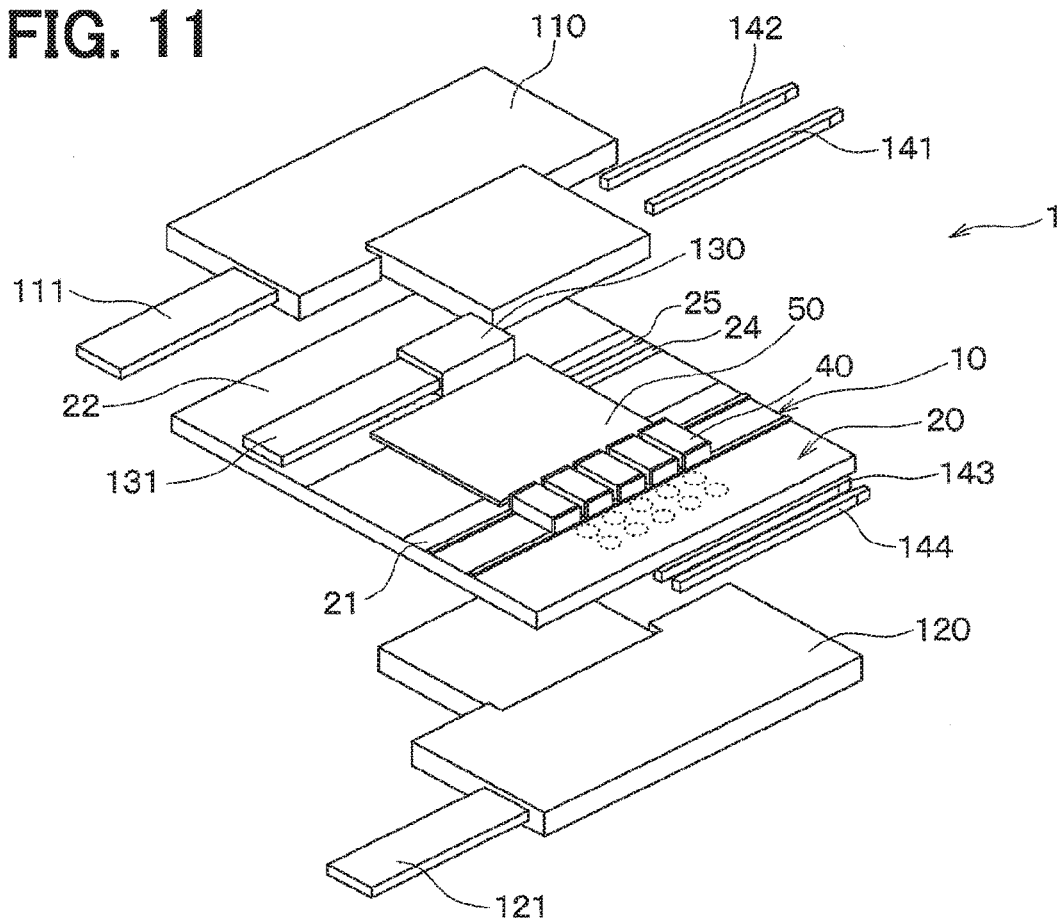
FIG. 11 is an exploded perspective view of a semiconductor module according to a fifth embodiment.
Figure 12:
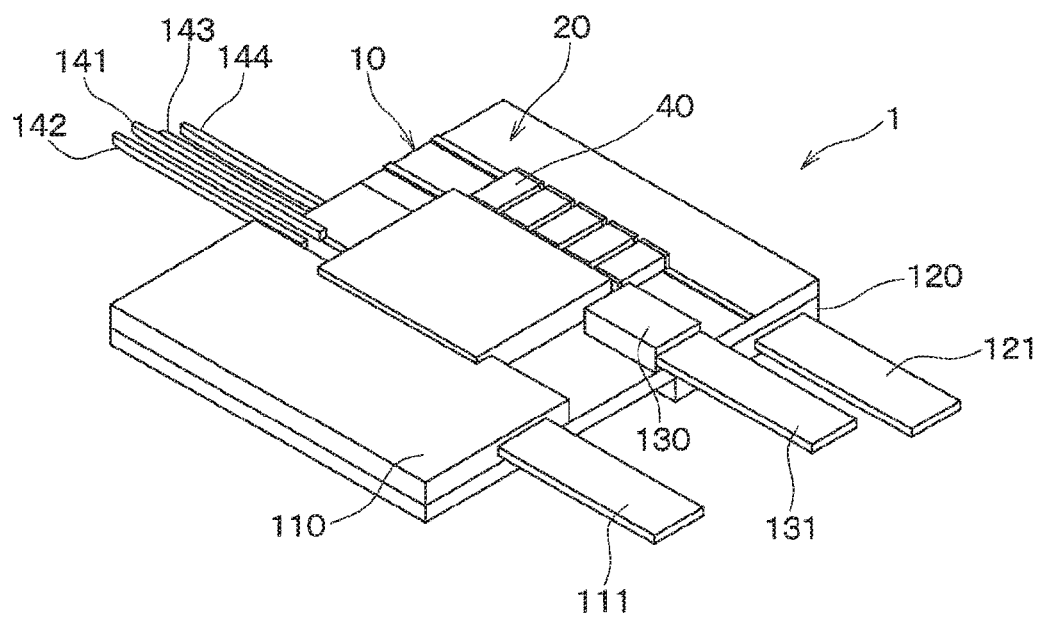
FIG. 12 is a perspective view of the semiconductor module according to the fifth embodiment.
Figure 13:
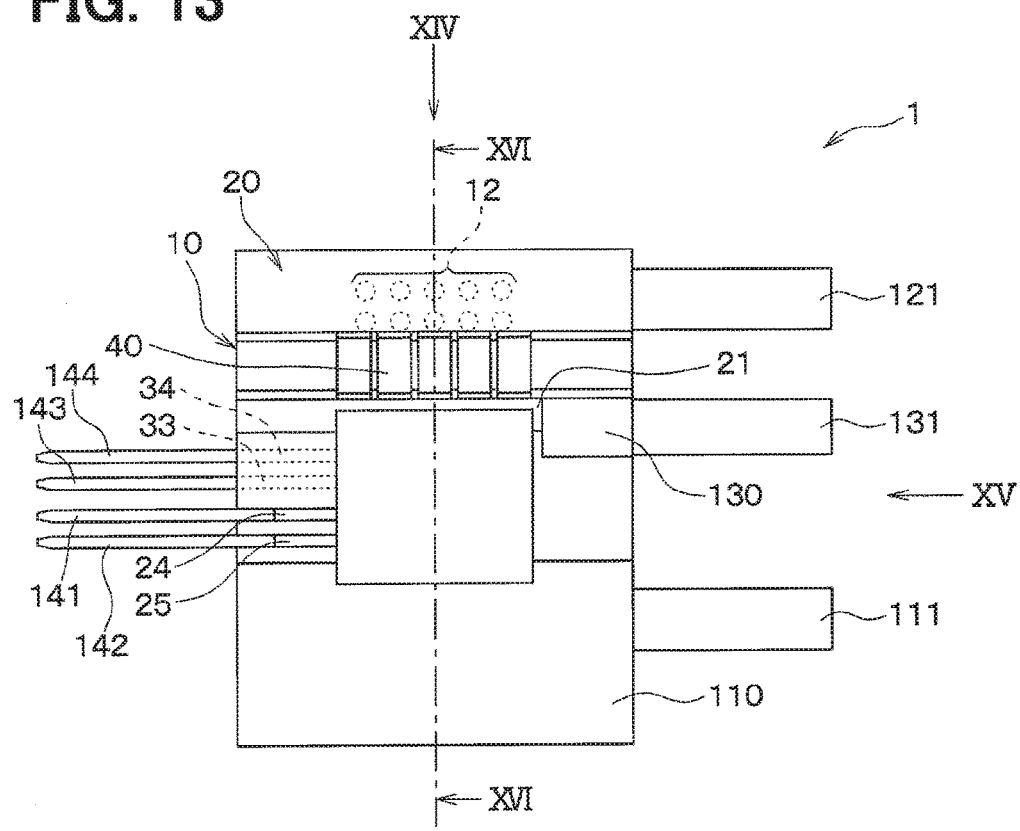
FIG. 13 is a top view of the semiconductor module according to the fifth embodiment.
Figure 14:
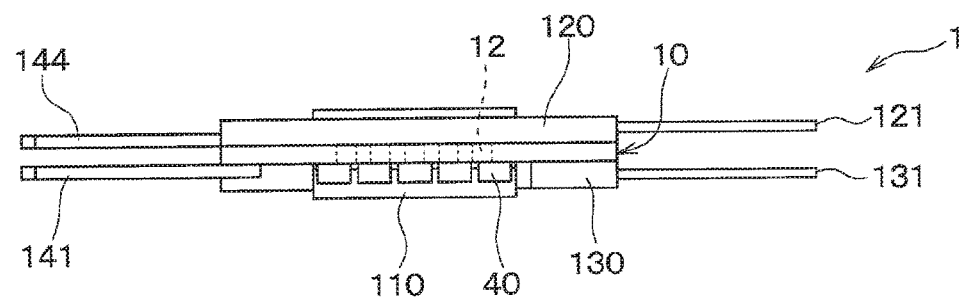
FIG. 14 is a view taken in a direction of an arrow XIV of FIG. 13.
Figure 15:
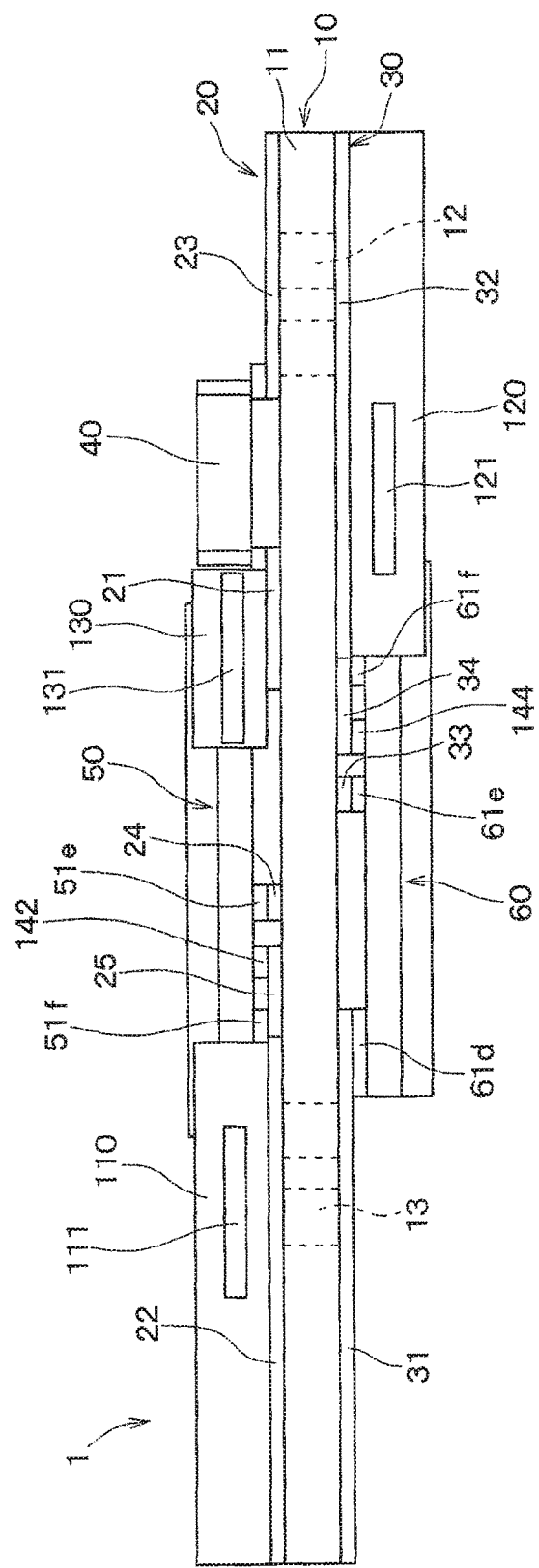
FIG. 15 is a view taken in a direction of an arrow XV of FIG. 13.
Figure 16:
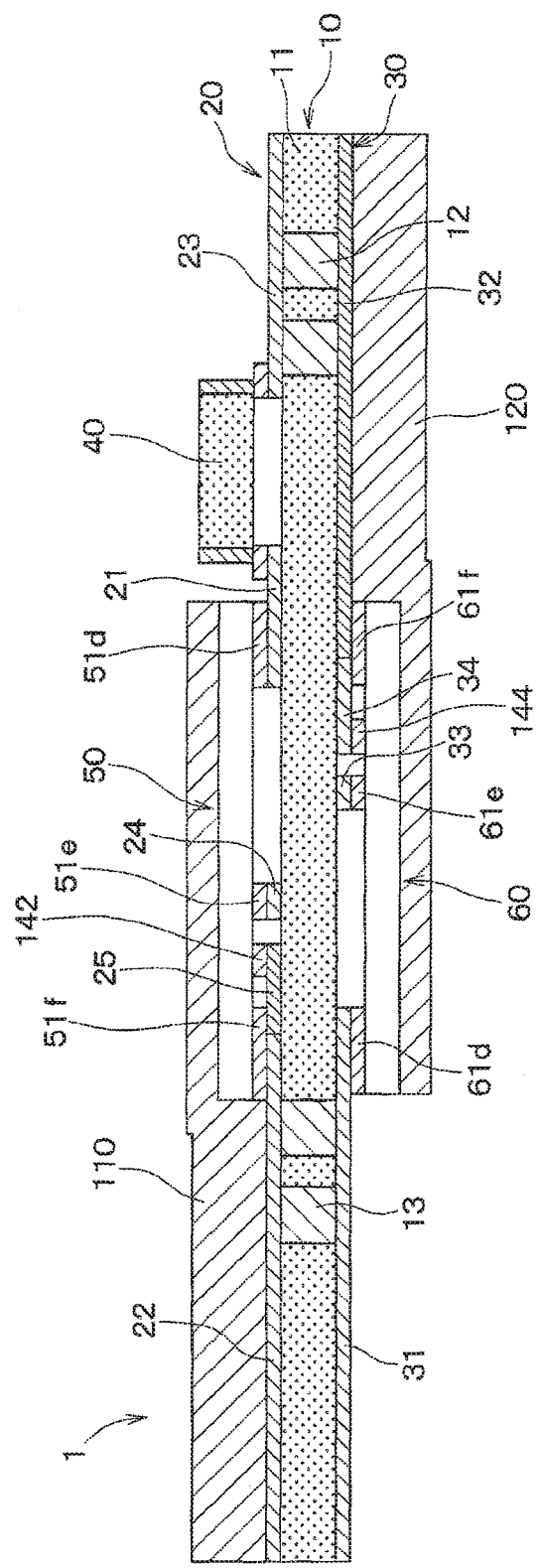
FIG. 16 is a sectional view taken along a line XVI-XVI of FIG. 13.

As shown in FIG. 10, in the present embodiment, a capacitor 40 is made of a first pattern 20 and a second pattern 30 that are opposed to each other across an insulating layer 11. That is, in the present embodiment, a parasitic capacitance between a P wiring 21 of the first pattern 20 and an N wiring 32 of the second pattern 30 is used for suppressing a surge voltage.

In the present embodiment in which the capacitor 40 is configured as described above, the first pattern 20, the insulating layer 11 of an substrate 10, and the second pattern 30 also serve as constituents of the capacitor 40, thereby enabling further reduction in manufacturing cost of the semiconductor module 1. Further, reducing the loop area of a loop path Pa1 leads to further reduction in inductance and further suppression in surge voltage.

Fifth Embodiment

A fifth embodiment of the present disclosure will be described. The present embodiment is obtained by adding a heat sink to the first embodiment while the others are the same as those in the first embodiment, and therefore, only the difference from the first embodiment will be described.

As shown in FIGS. 11 to 16, the semiconductor module 1 of the present embodiment includes a first heat sink 110, a second heat sink 120, and a third heat sink 130, in addition to the configuration of the semiconductor module 1 of the first embodiment. Further, a first semiconductor device 50 and a second semiconductor device 60 of the present embodiment are not encapsulated with resin, but are made to be bare chips.

The first heat sink 110 is a conductive heat sink that is configured to cool the first semiconductor device 50. The first heat sink 110 is connected to the first pattern 20 and fixes a potential of the substrate 51a of the first semiconductor device 50. Specifically, the first heat sink 110 is connected to the O wiring 22 and the substrate 51a, and electrically connects the substrate 51a, the O wiring 22 and the source electrode 51f.

The second heat sink 120 is a conductive heat sink that is configured to cool the second semiconductor device 60. The second heat sink 120 is connected to the second pattern 30, and fixes a potential of the substrate 61a of the second semiconductor device 60. Specifically, the second heat sink 120 is connected to the N wiring 32 and the substrate 61a, and electrically connects the substrate 61a, the N wiring 32, and the source electrode 61f.

The third heat sink 130 is a conductive heat sink that is configured to cool the substrate 10, is disposed on the P wiring 21, and is electrically connected to the P wiring 21.

The first heat sink 110, the second heat sink 120, and the third heat sink 130 are respectively provided with an O terminal 111, an N terminal 121, and a P terminal 131 for connecting the semiconductor module 1 disposed in a heat exchanger 150 to external wirings.

Further, the semiconductor module 1 of the present embodiment includes a G terminal 141 and an SS terminal 142 that are control terminals configured to control the first semiconductor device 50, and a G terminal 143 and an SS terminal 144 that are control terminals configured to control the second semiconductor device 60. Each of the G terminal 141, the SS terminal 142, the G terminal 143, and the SS terminal 144 has a straight shape, and one end thereof is connected to the G wiring 24, the SS wiring 25, the G wiring 33, and the SS wiring 34, while the other end thereof is connected to the control circuit 5. The G terminal 141, the SS terminal 142, the G terminal 143, and the SS terminal 144 correspond to control terminals, respectively.

The O terminal 111, the N terminal 121, the P terminal 131, the G terminal 141, the SS terminal 142, the G terminal 143, and the SS terminal 144 extend orthogonal to a direction of a current flowing in the loop path Pa1.

Figure 17:
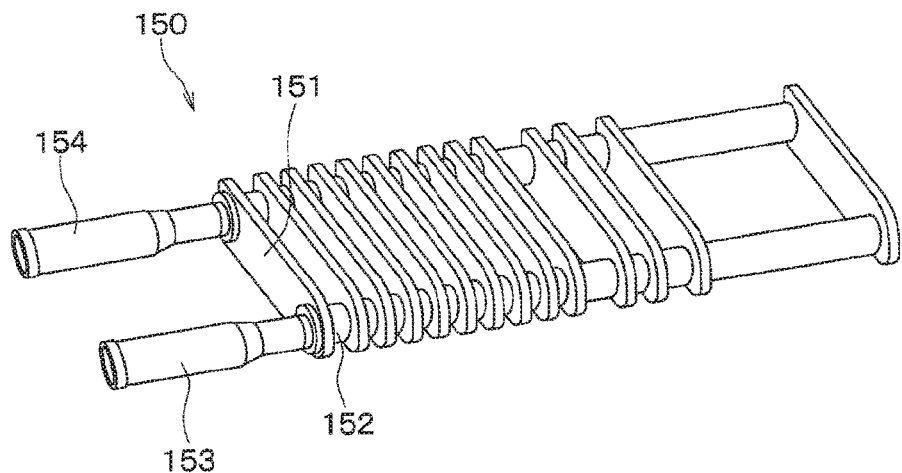
FIG. 17 is a perspective view of a heat exchanger.

By disposing the semiconductor module 1 with such a configuration in the heat exchanger 150 shown in FIG. 17, the semiconductor module 1 can be cooled. The heat exchanger 150 includes a passage tube 151, a projecting tube portion 152, a medium introducing portion 153, and a medium lead-out portion 154.

The passage tube 151 is a flat tube having a medium flow path therein to flow a heating medium therethrough. As shown in FIG. 17, the heat exchanger 150 is configured by stacking a plurality of passage tubes 151.

The semiconductor module 1 is disposed between two adjacent passage tubes 151. Specifically, the semiconductor module 1 is disposed such that the first heat sink 110 and the third heat sink 130 are in contact with one of the passage tubes 151 placed on both sides, and that the second heat sink 120 is in contact with the other of the passage tubes 151. An insulating layer (not shown) is formed in portions on the surfaces of the first heat sink 110, the second heat sink 120, and the third heat sink 130 that are in contact with the passage tube 151 to electrically insulate the first heat sink 110, the second heat sink 120, and the third heat sink 130 from the passage tube 151.

Each of the G terminal 141, the SS terminal 142, the G terminal 143, and the SS terminal 144 extends such that one end thereof is located outside the heat exchanger 150 when the semiconductor module 1 is disposed between the passage tubes 151, and is connected to the control circuit 5 by wiring (not shown).

Similarly, each of the O terminal 111, the N terminal 121, and the P terminal 131 extends such that one end thereof is located outside the heat exchanger 150 when the semiconductor module 1 is disposed between the passage tubes 151. The O terminal 111 is connected to the load 3 by wiring (not shown), and the N terminal 121 and the P terminal 131 are connected to the power supply 2.

In the present embodiment, two semiconductor modules that apply voltages to the V phase and the W phase of the three-phase AC motor and the semiconductor module 1 are each disposed between the passage tubes 151. Specifically, the semiconductor module 1 for applying a voltage to the U phase of the three-phase AC motor, a semiconductor module for applying a voltage to the V phase, and a semiconductor module for applying a voltage to the W phase of the three-phase AC motor are stacked in this order, with the passage tube 151 interposed between each of the semiconductor modules. Further, in the present embodiment, a plurality of these semiconductor modules are prepared, and a plurality of stacked structures including three semiconductor modules and passage tubes 151 are configured.

Further, each semiconductor module is disposed such that the G terminal and the SS terminal of each semiconductor module extend in the same direction, and the O terminal, the N terminal, and the P terminal of each semiconductor module extend in the same direction. Each G terminal and each SS terminal are connected to the control circuit 5 by wiring (not shown), each O terminal is connected to the load 3, and each N terminal and each P terminal are connected to the power supply 2.

The passage tube 151 has projecting tube portions 152 at longitudinal ends thereof. The projecting tube portions 152 are tubes coupling the adjacent passage tubes 151, and are open in a stacking direction of the passage tubes 151 and each has a cylindrical shape projecting in the stacking direction of the passage tubes 151.

Of the plurality of passage tubes 151, the passage tubes 151 other than a pair of outermost passages tubes 151 located at the outermost ends in the stacking direction are provided with the projecting tube portions 152 on both sides thereof in the stacking direction. On the other hand, of the plurality of passage tubes 151, the pair of passage tubes 151 located at the outermost ends in the stacking direction is provided with the projecting tube portion 152 only on a side opposed to the adjacent passage tubes 151.

The plurality of passage tubes 151 are coupled by fitting the projecting tube portions 152 to each other and joining sidewalls of the projecting tube portion 152 to each other. Accordingly, the medium flow paths of the adjacent passage tubes 151 communicate with each other.

As shown in FIG. 17, the medium introducing portion 153 and the medium lead-out portion 154 are connected to one of the pair of passage tubes 151 disposed at the outermost ends in the stacking direction among the plurality of passage tubes 151. The medium introducing portion 153 is a tube for introducing the heat medium into the heat exchanger 150, and the medium lead-out portion 154 is a tube for leading out the heat medium from the heat exchanger 150. The medium introducing portion 153 and the medium lead-out portion 154 are joined to the passage tube 151 by a joining technique such as brazing.

In the present embodiment, in the heat exchanger 150, the heat medium is supplied to the heat exchanger 150 through the medium introducing portion 153 by a pump (not shown), passes through the inside of each passage tube 151, and passes through the medium lead-out portion 154, to be discharged from the heat exchanger 150. At this time, the semiconductor module 1 is cooled by heat exchange between the heat medium and each of the first heat sink 110, the second heat sink 120, and the third heat sink 130 provided in the semiconductor module 1.

When a large current flows in the semiconductor module 1, the amount of heat generated by the semiconductor module 1 increases. At this time, as in the present embodiment, the semiconductor module 1 is provided with the heat sink, and the semiconductor module 1 is disposed in the heat exchanger 150. Thus, it is possible to cool the semiconductor module 1 and prevent breakage of the semiconductor module 1 due to high temperature.

Further, in the present embodiment, a resin molding is omitted. This makes it possible to reduce the size of the module while cooling the semiconductor module 1 and preventing breakage of the semiconductor module 1 due to high temperature.

In the present embodiment, the first semiconductor device 50 is made to be a bare chip, and the substrate 51a included in the transistor 51 of the first semiconductor device 50, the O wiring 22, and the source electrode 51f are electrically connected via the first heat sink 110. Hence, it is possible to fix the potential of the substrate 51a of the transistor 51.

Further, in the present embodiment, the second heat sink 120 electrically connects the substrate 61a of the transistor 61, the N wiring 32, and the source electrode 61f. Hence, it is possible to fix the potential of the substrate 61a of the transistor 61.

Other Embodiments

The present disclosure is not limited to the embodiments described above, and can be variously modified without departing from the gist of the present disclosure For example, in the first embodiment, the capacitor 40 is disposed adjacent to the front surface of the substrate 10, but alternatively, the capacitor 40 may be disposed adjacent to the rear surface of the substrate 10.

In the first embodiment, the semiconductor module 1 is a semiconductor module having the 2-in-1 structure in which two arms are integrated, but alternatively, the semiconductor module 1 may include a plurality of first semiconductor devices and a plurality of second semiconductor devices. For example, the semiconductor module 1 may be a semiconductor module having a 4-in-1 structure in which four arms are integrated, and the semiconductor module 1 may include first semiconductor devices 50, 70 and second semiconductor devices 60, 80. In this case, a plurality of loop paths may be formed by the plurality of first semiconductor devices and the plurality of second semiconductor devices, a plurality of circuits including the loop paths may be configured, and the plurality of circuits including the loop paths each may be connected in parallel with the power supply 2. The semiconductor module 1 may include first semiconductor devices 50, 90 and second semiconductor devices 60, 100. The semiconductor module 1 may include first semiconductor devices 70, 90 and second semiconductor devices 80, 100. Further, the semiconductor module 1 may be a semiconductor module having a 6-in-1 structure in which six arms are integrated, and the semiconductor module 1 may include first semiconductor devices 50, 70, 90 and second semiconductor devices 60, 80, 100.

Figure 18:
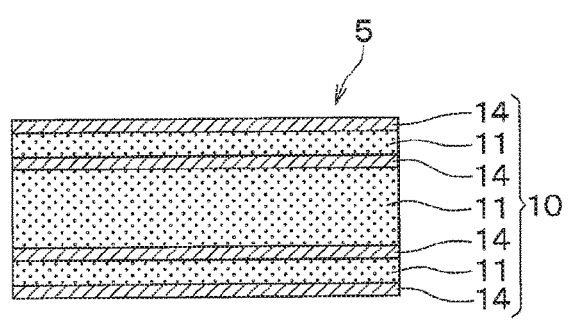
FIG. 18 is a sectional view of a substrate.

In the first to fifth embodiments, the control circuit 5 is disposed separately from the substrate 10, but alternatively, the control circuit 5 may be formed on the substrate 10. In this case, as shown in FIG. 18, the substrate 10 may be a multilayer substrate that includes a plurality of insulating layers 11 and a plurality of wiring layers 14 that are stacked alternately. The plurality of wiring layers 14 are made of, for example, Cu. The control circuit 5 may include the plurality of insulating layers 11 and the plurality of wiring layers 14. Forming the control circuit 5 on the substrate 10 enables reduction in size of the portion including the semiconductor module 1 and the control circuit 5 in the inverter circuit.

Figure 19:
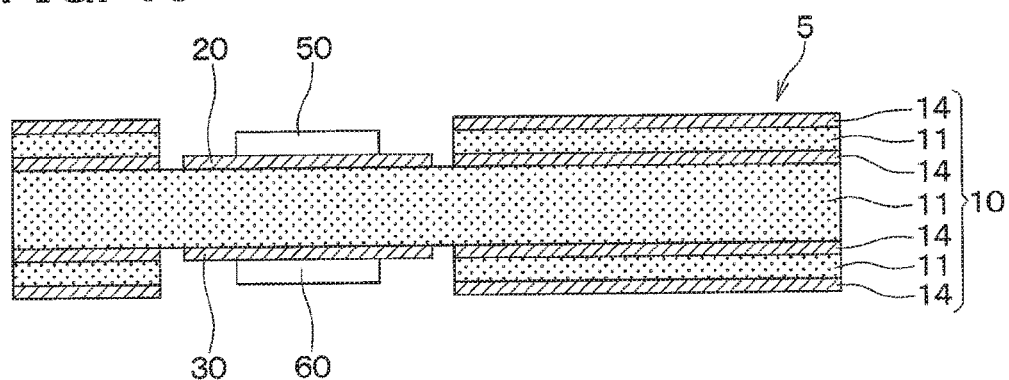
FIG. 19 is a sectional view of another substrate.

At this time, as shown in FIG. 19, the portion of the substrate 10 in which the first semiconductor device 50 and the second semiconductor device 60 are disposed may have a two-layer structure in which a first pattern 20 is formed on a front surface of an insulating layer 11 and a second pattern 30 is formed on a rear surface of the insulating layer 11. Accordingly, the loop area of the loop path Pa1 is kept small while reducing the size of the portion in the inverter circuit that includes the semiconductor module 1 and the control circuit 5, and thus it is possible to suppress the surge voltage in the same manners as the first to fifth embodiments described above.

In the first to fourth embodiments, each of the first semiconductor device 50 and the second semiconductor device 60 is encapsulated with resin, but alternatively, the first semiconductor device 50 and the second semiconductor device 60 may be made to be bare chips without being encapsulated with resin. However, it is practically preferable to encapsulate each of the first semiconductor device 50 and the second semiconductor device 60 with resin.

Figure 20:
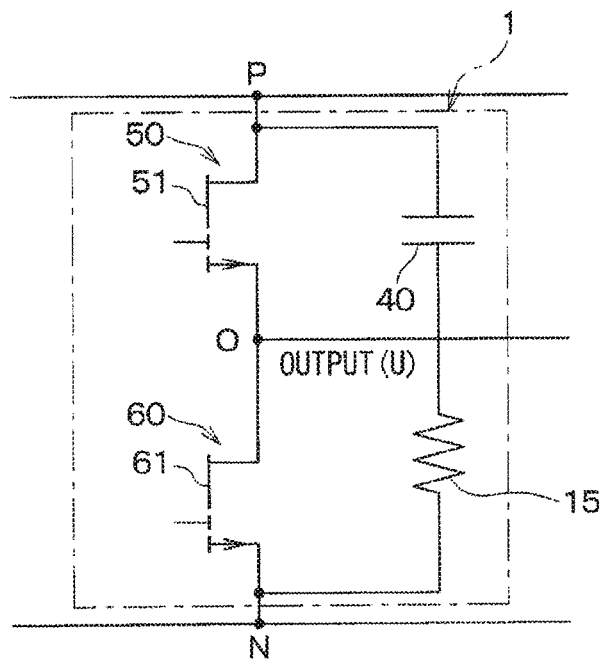
FIG. 20 is a circuit diagram of a semiconductor module according to another embodiment.

In the first to fifth embodiments, as shown in FIG. 20, a resistor 15 may be connected in series to a capacitor 40 to constitute an RC circuit. This can suppress the resonance of the inverter circuit.

In the fifth embodiment, the substrate 51a, the O wiring 22, and the source electrode 51f are connected by the first heat sink 110, but alternatively, the substrate 51a, the P wiring 21, and the drain electrode 51d may be connected by the third heat sink 130, and the potential of the substrate 51a may be fixed to the potential of the drain electrode 51d.

In the fifth embodiment, the substrate 61a, the N wiring 32, and the source electrode 61f are electrically connected by the second heat sink 120, but alternatively, the substrate 61a, the O wiring 31 and the drain electrode 61d may be electrically connected.

The first semiconductor device 50 and the second semiconductor device 60 may each include a diode for temperature measurement. In this case, wiring for connecting the diode for temperature measurement to another equipment is preferably extended vertically to the loop path Pa1 in the same manner as each G wiring and each SS wiring.

The first semiconductor devices 50, 70, 90 may respectively include a plurality of transistors 51, 71, 91. The second semiconductor devices 60, 80, 100 may respectively include a plurality of transistors 61, 81, 101.

Figure 21:
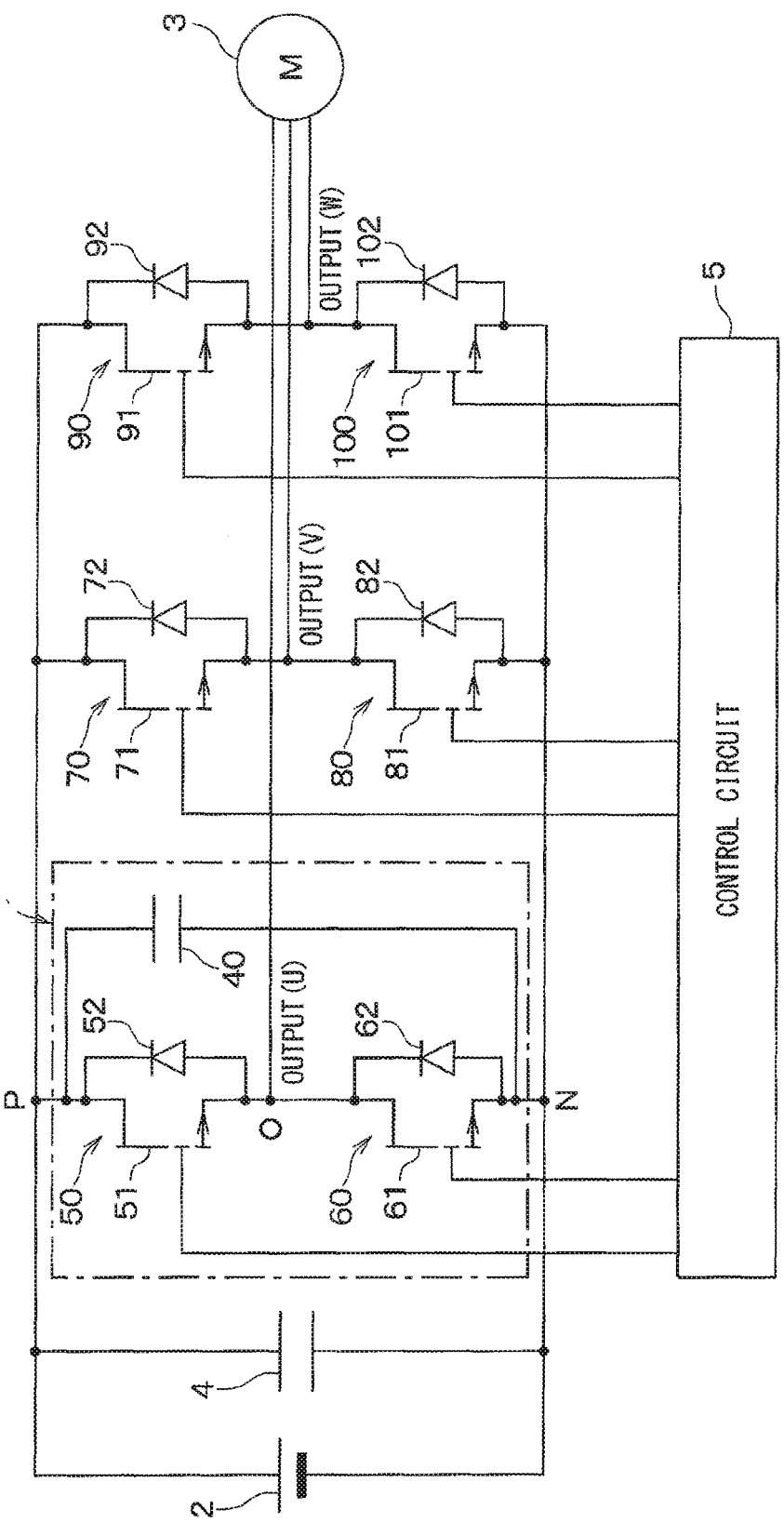
FIG. 21 is a circuit diagram of an inverter circuit including a semiconductor module according to another embodiment.

Further, as shown in FIG. 21, the first semiconductor devices 50, 70, 90 and the second semiconductor devices 60, 80, 100 may include diodes 52, 72, 92, 62, 82, 102 that are rectifying devices for reflux, such as a flywheel diode (FWD). In this case, cathode electrodes of the diodes 52, 72, 92, 62, 82, 102 are respectively connected to the drain electrodes of the corresponding transistors 51, 71, 91, 61, 81, 101. Anode electrodes of the diodes 52, 72, 92, 62, 82, 102 are respectively connected to the source electrodes of the corresponding transistors 51, 71, 91, 61, 81, 101. Each of the diodes 52, 72, 92 corresponds to a first rectifying device. Each of the diodes 62, 82, 102 corresponds to a second rectifying device.

Further, the transistors 51, 71, 91, 61, 81, 101 may be made up of a lateral SiC-MOSFET including a built-in diode that has a rectifying function in the same direction as those of the diodes 52, 72, 92, 62, 82, 102.

In the first to fifth embodiments, the description has been given of the example in which the semiconductor module 1 is used for the inverter circuit that drives a three-phase AC motor or the like for a vehicle, but alternatively, the present disclosure may be applicable to a power converter other than an inverter. For example, the present disclosure may be applicable to a DC/DC converter, a charger, or the like.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor module comprising:
a substrate that includes an insulating layer and a connecting portion disposed to connect a front surface and a rear surface of the insulating layer;
a first pattern that is a wiring pattern disposed on a front surface of the substrate;
a second pattern that is a wiring pattern disposed on a rear surface of the substrate;
a first semiconductor device that is disposed adjacent to the front surface of the substrate and includes a first switching device having a lateral structure;
a second semiconductor device that is disposed adjacent to the rear surface of the substrate and includes a second switching device having the lateral structure; and
a capacitor, wherein:
the first switching device includes a first drain electrode and a first source electrode;
the second switching device includes a second drain electrode and a second source electrode;
the first pattern, the second pattern, and the connecting portion form a loop path to electrically connect the first semiconductor device, the second semiconductor device, and the capacitor;
the first source electrode is connected to the second drain electrode;
the first drain electrode is connected to the second source electrode via the capacitor; and
in the loop path, a path formed by the first pattern and the first semiconductor device and a path formed by the second pattern and the second semiconductor device are opposed to each other across the substrate, and in the paths, currents flow in directions opposite to each other.

2. The semiconductor module according to claim 1, wherein
the first semiconductor device and the second semiconductor device are disposed opposite to each other across the substrate.

3. The semiconductor module according to claim 1, further comprising
a plurality of the capacitors that are connected in series in the loop path.

4. The semiconductor module according to claim 1, wherein:
the capacitor is disposed such that at least a part of the capacitor overlaps the substrate when viewed in a direction parallel to the front surface of the substrate; and
one of two electrodes of the capacitor is connected to the first pattern, and the other of the two electrodes is connected to the second pattern.

5. The semiconductor module according to claim 1, wherein
the capacitor is provided by the first pattern and the second pattern that are opposed to each other across the insulating layer.

6. The semiconductor module according to claim 1, further comprising
a resistor that is connected in series to the capacitor.

7. The semiconductor module according to claim 1, further comprising:
a first heat sink that is conductive and is configured to cool the first semiconductor device; and
a second heat sink that is conductive and is configured to cool the second semiconductor device.

8. The semiconductor module according to claim 7, wherein:
the first switching device includes a first substrate and a first stacked body that is disposed on a front surface of the first substrate;
the first drain electrode and the first source electrode are disposed on a front surface of the first stacked body; and
the first heat sink is connected to the first pattern and the first substrate.

9. The semiconductor module according to claim 7, wherein:
the second switching device includes a second substrate and a second stacked body that is disposed on a front surface of the second substrate;
the second drain electrode and the second source electrode are disposed on a front surface of the second stacked body; and
the second heat sink is connected to the second pattern and the second substrate.

10. The semiconductor module according to claim 1, further comprising
a control terminal that is configured to control one of the first semiconductor device and the second semiconductor device, wherein the control terminal extends orthogonal to a direction of a current flowing in the loop path.

11. The semiconductor module according to claim 1, wherein:
the substrate is a multilayer substrate that includes a plurality of the insulating layers and a plurality of wiring layers that are stacked alternately; and
the insulating layers and the wiring layers form a control circuit that is configured to control the first semiconductor device and the second semiconductor device.

12. The semiconductor module according to claim 11, wherein
a portion of the substrate in which the first semiconductor device and the second semiconductor device are disposed is configured in such a manner that the first pattern is disposed on a front surface of one of the insulating layers and the second pattern is disposed on a rear surface of the one of the insulating layers.

13. The semiconductor module according to claim 1, wherein:

the first semiconductor device includes a plurality of the first switching devices; and the second semiconductor device includes a plurality of the second switching devices.

14. The semiconductor module according to claim 1, wherein:
   the first semiconductor device includes a first rectifying device that is connected in parallel with the first switching device; and
   the second semiconductor device includes a second rectifying device that is connected in parallel with the second switching device.

15. The semiconductor module according to claim 1, further comprising:
   a plurality of the first semiconductor devices;
   a plurality of the second semiconductor devices;
   a plurality of the loop paths that are formed by the plurality of first semiconductor devices and the plurality of second semiconductor devices; and
   a plurality of circuits that include the plurality of the loop paths and are connected in parallel with a power supply for supplying power to the first semiconductor device and the second semiconductor device.

* * * * *